United States Patent
Buynoski et al.

(10) Patent No.: US 9,461,247 B2
(45) Date of Patent: *Oct. 4, 2016

(54) METHOD OF FORMING CONTROLLABLY CONDUCTIVE OXIDE

(71) Applicant: Cypress Semiconductor Corporation, San Jose, CA (US)

(72) Inventors: Matthew Buynoski, Palo Alto, CA (US); Seungmoo Choi, Newport Beach, CA (US); Chakravarthy Gopalan, Santa Clara, CA (US); Dongxiang Liao, Sunnyvale, CA (US); Christie Marrian, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/612,083

(22) Filed: Feb. 2, 2015

(65) Prior Publication Data

US 2015/0144857 A1    May 28, 2015

Related U.S. Application Data

(62) Division of application No. 11/899,597, filed on Sep. 6, 2007, now Pat. No. 8,946,020.

(51) Int. Cl.
*H01L 21/8242* (2006.01)
*H01L 45/00* (2006.01)
*H01L 21/316* (2006.01)

(52) U.S. Cl.
CPC ..... *H01L 45/1633* (2013.01); *H01L 21/31683* (2013.01); *H01L 45/04* (2013.01); *H01L 45/10* (2013.01); *H01L 45/1233* (2013.01); *H01L 45/146* (2013.01); *H01L 45/147* (2013.01); *H01L 45/165* (2013.01); *H01L 45/1608* (2013.01)

(58) Field of Classification Search
CPC .................. H01L 2924/00; H01L 2924/0002; H01L 28/40; H01L 28/60; H01L 27/10876; H01L 2224/48091; H01L 27/0629; H01L 2924/00014; H01L 23/5223; H01L 2224/48247; H01L 27/0207; H01L 29/94; H01L 27/10814
See application file for complete search history.

(56) References Cited

U.S. PATENT DOCUMENTS

| | | | |
|---|---|---|---|
| 4,297,782 A | 11/1981 | Ito | |
| 7,306,988 B1 * | 12/2007 | Avanzino | ............ H01L 45/1608 257/301 |
| 2004/0161888 A1 | 8/2004 | Rinerson et al. | |
| 2004/0169255 A1 | 9/2004 | Kiyotoshi | |

(Continued)

OTHER PUBLICATIONS

USPTO Final Rejection for U.S. Appl. No. 11/899,597 May 8, 2013; 12 pages.

(Continued)

*Primary Examiner* — Robert Bachner

(57) ABSTRACT

In fabricating a memory device, a first electrode is provided. An alloy is formed thereon, and the alloy is oxidized to provide an oxide layer. A second electrode is provided on the oxide layer. In a further method of fabricating a memory device, a first electrode is provided. Oxide is provided on the first electrode, and an implantation step in undertaken to implant material in the oxide to form a layer including oxide and implanted material having an oxygen deficiency and/or defects therein. A second electrode is then formed on the layer.

20 Claims, 5 Drawing Sheets

(56) References Cited

U.S. PATENT DOCUMENTS

2007/0114508 A1* 5/2007 Herner ............... H01L 45/145
257/2
2007/0267675 A1 11/2007 Cho et al.
2008/0185567 A1 8/2008 Kumar et al.

OTHER PUBLICATIONS

USPTO Final Rejection for U.S. Appl. No. 11/899,597 dated Jul. 12, 2012; 12 pages.
USPTO Final Rejection for U.S. Appl. No. 11/899,597 dated Aug. 18, 2010; 11 pages.
USPTO Final Rejection for U.S. Appl. No. 11/899,597 dated Nov. 9, 2011; 11 pages.
USPTO Final Rejection for U.S. Appl. No. 11/899,597 dated Nov. 10, 2009; 8 pages.
USPTO Final Rejection for U.S. Appl. No. 11/899,597 dated Dec. 23, 2013; 13 pages.
USPTO Non-Final Rejection for U.S. Appl. No. 11/899,597 dated Mar. 5, 2010; 11 pages.
USPTO Non-Final Rejection for U.S. Appl. No. 11/899,597 dated Mar. 9, 2012; 11 pages.
USPTO Non-Final Rejection for U.S. Appl. No. 11/899,597 dated Apr. 14, 2009; 7 pages.
USPTO Non-Final Rejection for U.S. Appl. No. 11/899,597 dated May 9, 2011; 10 pages.
USPTO Non-Final Rejection for U.S. Appl. No. 11/899,597 dated Sep. 10, 2013; 12 pages.
USPTO Non-Final Rejection for U.S. Appl. No. 11/899,597 dated Nov. 21, 2012; 11 pages.
USPTO Notice of Allowance for U.S. Appl. No. 11/899,597 dated Sep. 29, 2014; 8 pages.

* cited by examiner

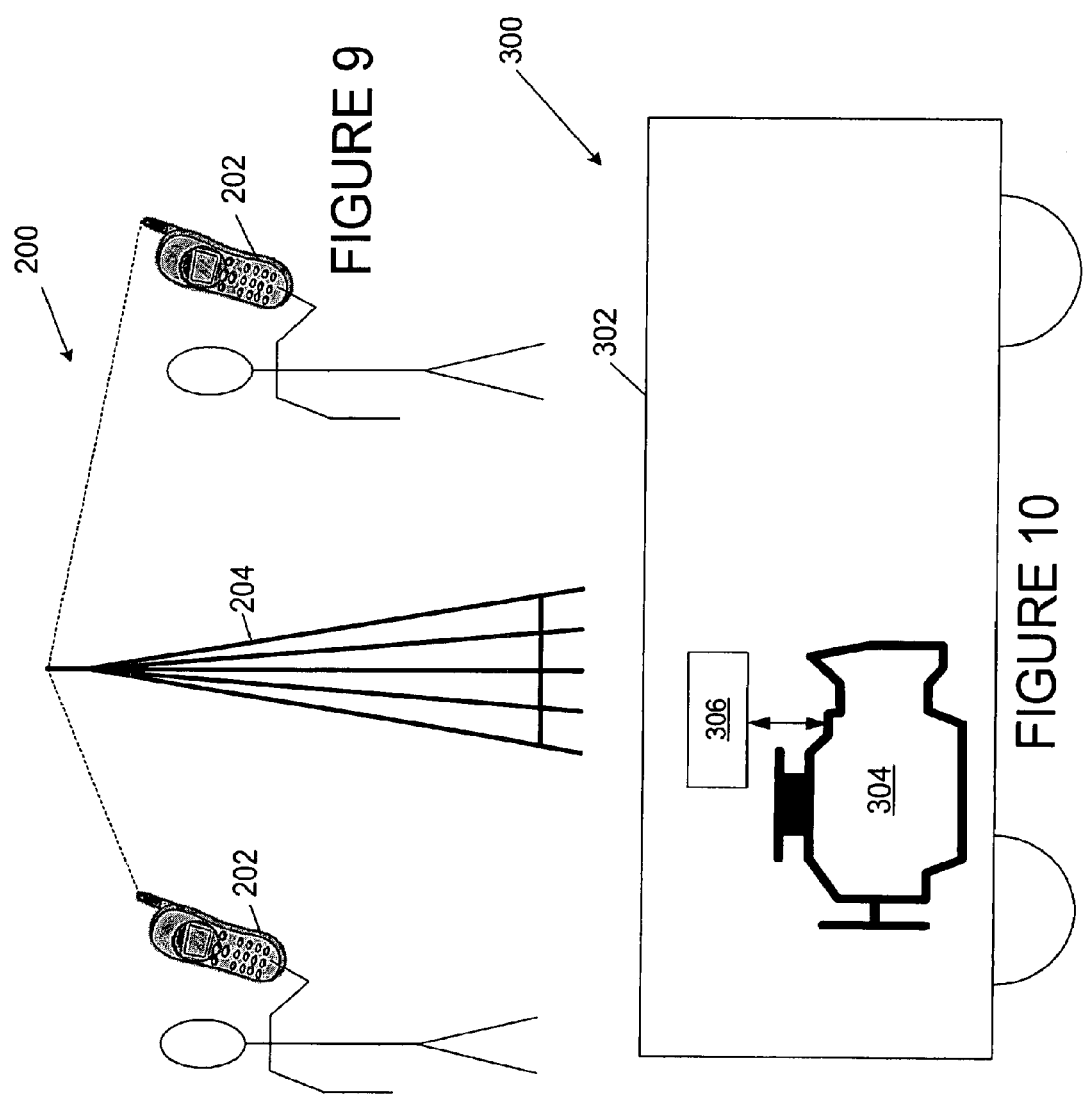

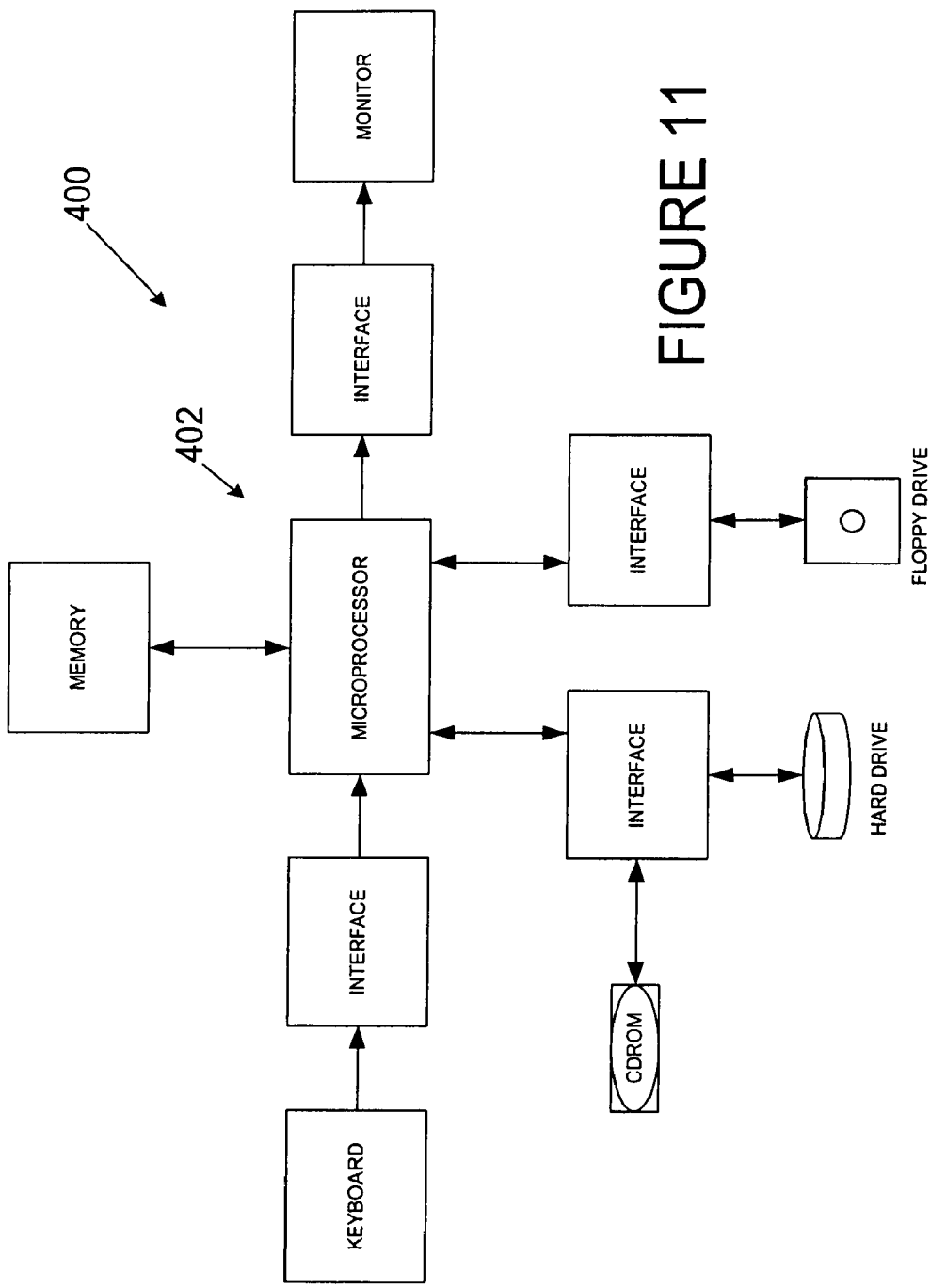

METHOD OF FORMING CONTROLLABLY CONDUCTIVE OXIDE

CROSS-REFERENCE TO RELATED APPLICATIONS

This application is a divisional of U.S. patent application Ser. No. 11/899,597, filed on Sep. 6, 2007, entitled "Method of Forming Controllably Conductive Oxide," which is hereby incorporated herein by reference in its entirety.

BACKGROUND OF THE INVENTION

1. Technical Field

This invention relates generally to electronic devices, and more particularly, to resistive memory devices.

2. Background Art

FIG. 1 illustrates a metal-insulator-metal (MIM) memory device 30. The memory device 30 includes an electrode 32 (for example copper), an insulating layer 34 (for example $Ta_2O_5$) on the electrode 32, and an electrode 36 (for example titanium) on the insulating layer 34. Initially, assuming that the memory device 30 is unprogrammed, in order to program the memory device 30, ground is applied to the electrode 32, while a positive voltage is applied to electrode 36, so that an electrical potential $V_{pg}$ is applied across the memory device 30 from a higher to a lower electrical potential in the direction from electrode 36 to electrode 32. This causes the overall memory device 30 to adopt a conductive, low-resistance (programmed) state (A, FIG. 2). Upon removal of such potential the memory device 30 remains in a conductive or low-resistance state having an on-state resistance illustrated at B.

In the read step of the memory device 30 in its programmed (conductive) state, an electrical potential $V_r$ is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device 30, a positive voltage is applied to the electrode 32, while the electrode 36 is held at ground, so that an electrical potential $V_{er}$ is applied across the memory device 30 from a higher to a lower electrical potential in the direction of from electrode 32 to electrode 36. Application of this electrical potential causes the overall memory device 30 to adopt a high-resistance (erased) state illustrated at C.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the layer 34 (and memory device 30) in a high-resistance or substantially non-conductive state, the memory device 30 will not conduct significant current, which indicates that the memory device 30 is in its erased state.

It will be understood that a memory device of this general type should be capable of use in a variety of conditions. For example, different device programming and erasing thresholds and on-resistance characteristics may be needed in different applications. Meanwhile, such a memory device should have rapid switching speed and show high stability in its programmed and erased states.

Therefore, what is needed is an approach wherein a memory device of the general type described above may be readily configured so as to be usable in a variety of conditions, meanwhile exhibiting rapid switching speed and high data storage stability.

DISCLOSURE OF THE INVENTION

Broadly stated, the present method of fabricating a memory device comprises providing a first electrode, providing an alloy, oxidizing the alloy to provide an oxide layer, and providing a second electrode.

Broadly stated, the present method of fabricating a memory device further comprises providing a first electrode, providing oxide, implanting material in the oxide to form a layer comprising oxide and implanted material having an oxygen deficiency and/or defects therein, and providing a second electrode.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of a illustrative embodiments when read in conjunction with the accompanying drawings, wherein:

FIGS. 9-11 are systems incorporating memory devices of the present type.

BEST MODE(S) FOR CARRYING OUT THE INVENTION

Reference is now made in detail to specific embodiments of the present invention which illustrate the best mode presently contemplated by the inventor for practicing the invention.

Figure 1:
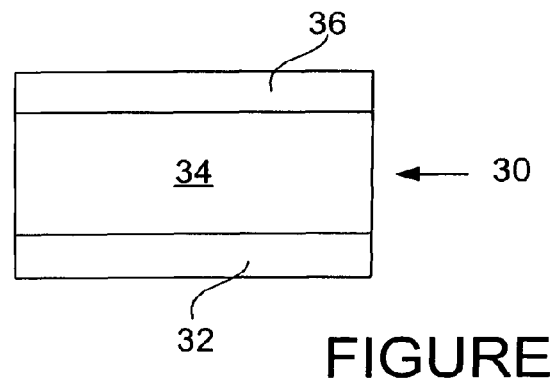
FIG. 1 is a cross-sectional view of an above-described memory device.
Figure 2:
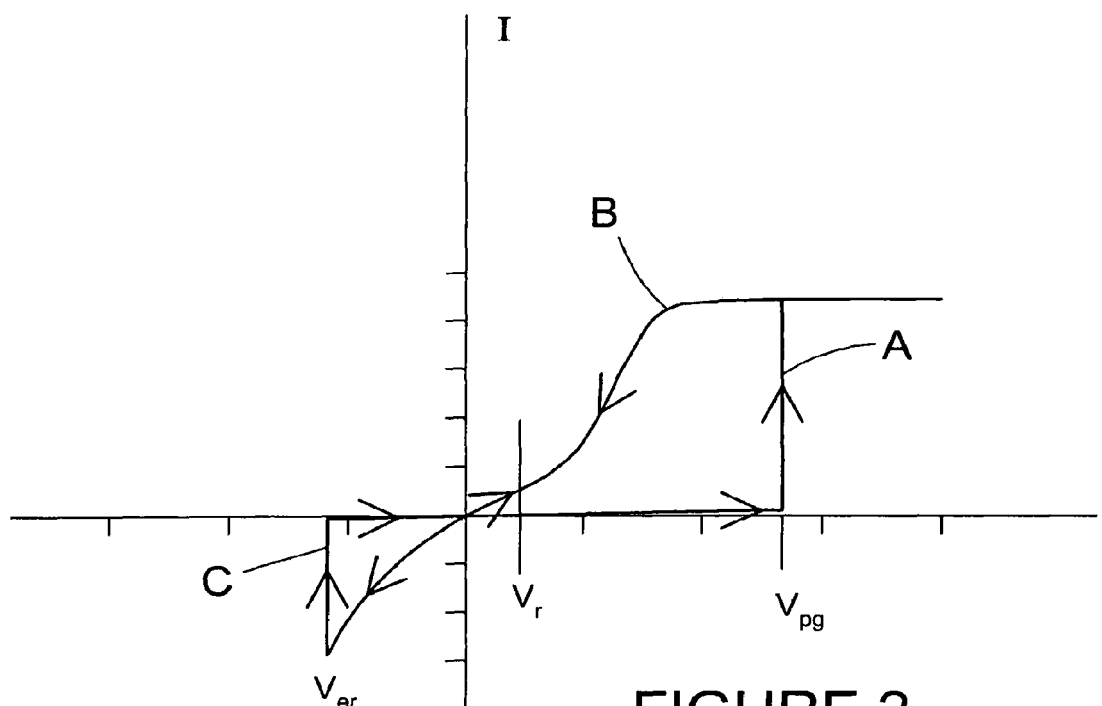
FIG. 2 is a plot of current vs. voltage illustrating operating characteristics of the memory device of FIG. 1.
Figure 3:
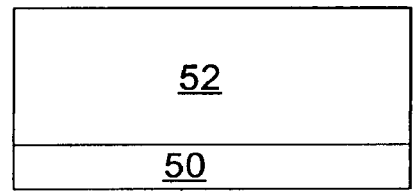
FIGS. 3-8 illustrate various embodiments of the present invention.
Figure 4:
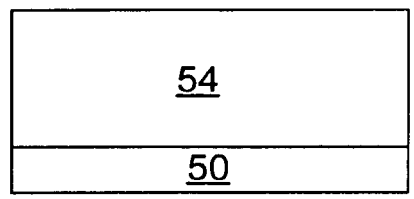
Figure 5:
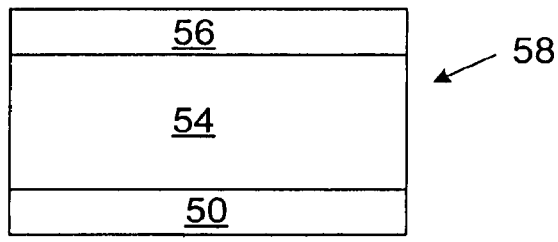

FIGS. 3-5 illustrate a first method for fabricating a metal-insulator-metal (MIM) resistive memory device of the type generally described above. With reference to FIG. 3, initially, an electrode 50 (for example copper) is provided. Next, an alloy 52 of selected metals is deposited on the electrode 50. In this specific embodiment, the alloy 52 includes tantalum and titanium in a mixture thereof. An oxidation step (for example thermal oxidation, plasma-assisted oxidation, or UV-light assisted oxidation) is undertaken to fully oxidize the alloy to form an oxide layer 54 (which is a mixture of titanium oxide and tantalum oxide, i.e., $TiO_2$ and $Ta_2O_5$) on and in contact with the electrode 50 (FIG. 4). Then, a second electrode 56 (for example titanium) is provided on and in contact with the oxide layer 54 to form the metal-insulator-metal (MIM) memory device 58 (FIG. 5).

The content of the oxide layer depends 54 on the particular metals and proportions thereof making up the alloy 52. In this particular case, the oxide layer 54 made up of the mixture of $TiO_2$ and $Ta_2O_5$ has operational characteristics which are different from that of the $Ta_2O_5$ layer 34 of the previously described device. Indeed, the operational characteristics of the overall memory device 58 will depend on the particular metals and proportions thereof making up the alloy 54. Thus, the operational characteristics of the fabricated memory device 58, i.e., for example, program and erase voltages, on-resistance characteristics, and device stability may be based on the selected content of the alloy 54 as required.

Figure 6:
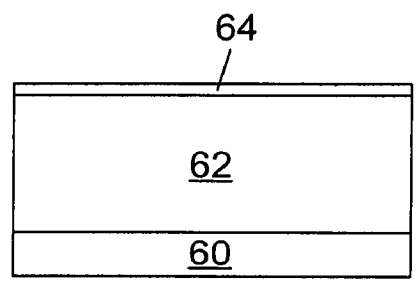
Figure 7:
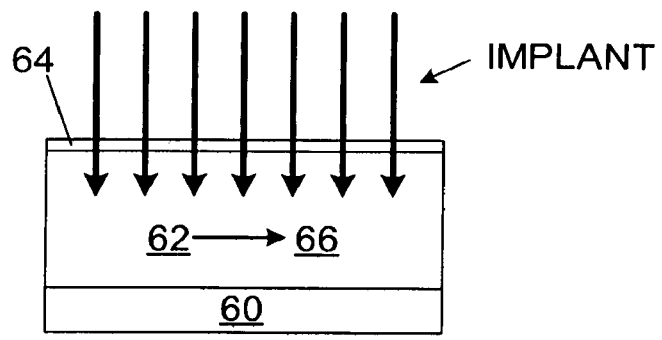
Figure 8:
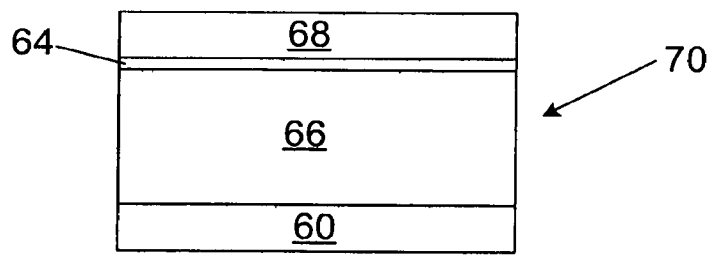

FIGS. 6-8 illustrate various other embodiments of the invention. Initially (FIG. 6), an electrode 60 (for example copper) is provided. Next, an oxide 62 (in this particular embodiment $Ta_2O_5$) is provided on and in contact with the electrode 60 by any suitable means. A thin metal protective layer 64, for example, aluminum, may then be deposited on and in contact with the oxide 62. Next (FIG. 7), an implantation step for implanting material through the layer 64 and into the oxide 62 is undertaken. This implantation step may take a number of forms. For example, the implanted material may be titanium, nitrogen, or silicon. Each of these materials when so implanted in the $Ta_2O_5$ will pull oxygen away from the tantalum in the oxide 62 to create a layer 66 comprising oxide and the implanted material which has an overall oxygen deficiency, thereby decreasing resistance thereof as compared to a $Ta_2O_5$ layer. The implanted material may further for example be tantalum, which also will create a layer 66 comprising oxide and the implanted material having an overall oxygen deficiency by providing an excess of metal atoms for the oxygen present in the layer. The protective layer 64 is included in order to seal out atmospheric oxygen in order to retain the oxygen-deficient state of the layer 66. Then, a second electrode 68 (for example titanium) is provided on and in contact with the protective layer 64 to form the metal-insulator-metal (MIM) memory device 70 (FIG. 8).

The implantation step also causes damage to the oxide 62, causing defects in the layer 66 comprising oxide and the implanted material so as to increase the conductivity thereof. Indeed, materials for implantation may be selected to cause damage to the oxide 62 without causing an oxygen deficiency therein (for example inert implant materials such as argon, krypton or xenon). Indeed, oxygen itself may be implanted for this purpose.

The operational characteristics of the fabricated memory device 70, i.e., for example, program and erase voltages, on-resistance characteristics, and device stability and may be based on the content of the implanted material as required.

FIG. 9 illustrates a system 200 utilizing memory devices as described above. As shown therein, the system 200 includes hand-held devices 202 in the form of cell phones, which communicate through an intermediate apparatus such as a tower 204 (shown) and/or a satellite. Signals are provided from one cell phone to the other through the tower 204. Such a cell phone with advantage uses memory devices of the type described above for data storage, for example names, telephone number and other data. One skilled in the art will readily understand the advantage of using such memory devices in other hand-held devices 202 which utilize data storage, such as portable media players, personal digital assistants, digital cameras and the like.

FIG. 10 illustrates another system 300 utilizing memory devices as described above. The system 300 includes a vehicle 302 having an engine 304 controlled by an electronic control unit 306. The electronic control unit 306 with advantage uses memory devices of the type described above for data storage, or example data relating to engine and vehicle operating conditions.

FIG. 11 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a memory device, the method comprising:
    forming a first electrode,
        wherein the first electrode is a single layer;
    forming an alloy on the first electrode;
    oxidizing the alloy to provide an oxide;
    implanting material in the oxide to form an implanted material layer comprising the oxide and the material,
        the implanted material layer having a conductivity higher than a conductivity of the oxide before material implantation,
        wherein an increase in the conductivity of the implanted material layer is proportional to an amount of the material implanted in the oxide; and
    forming a second electrode,
        wherein the second electrode overlays the oxide and the implanted material layer.

2. The method of claim 1, wherein implanting the material in the oxide provides an oxygen deficiency in the oxide.

3. The method of claim 2, wherein the material implanted into the oxide is selected from the group consisting of titanium, nitrogen, silicon, and tantalum.

4. The method of claim 1, wherein implanting the material in the oxide provides defects throughout the implanted material layer.

5. The method of claim 2, wherein the material implanted into the oxide is an inert material.

6. The method of claim 5, wherein the material implanted into the oxide is selected from the group consisting of argon, krypton, and xenon.

7. The method of claim 1, wherein the increase in the conductivity of the implanted material layer provides a selected level of the conductivity of the implanted material layer, the selected level of the conductivity providing at least one of a selected program voltage, erase voltage, on-resistance characteristics, and device stability.

8. The method of claim 1, wherein the oxide layer is formed on and in contact with the first electrode.

9. The method of claim 1, wherein the second electrode is in contact with the implanted material layer.

10. The method of claim 1, wherein the oxide layer comprises tantalum and titanium.

11. The method of claim 1, wherein the memory device is a metal-insulator-metal (MEM) memory device.

12. The method of claim 1, wherein the alloy is oxides using a technique selected from the group consisting of thermal oxidation, plasma-assisted oxidation, or UV-light assisted oxidation.

13. The method of claim 1, wherein the alloy is fully oxidized.

14. The method of claim 1, wherein the first electrode is copper.

15. The method of claim 1, further comprising, prior to implanting the material in the oxide, forming a protective layer over the oxide, wherein implanting the material in the oxide is performed through the protective layer.

16. The method of claim 15, wherein the protective layer comprises aluminum.

17. The method of claim 15, wherein the protective layer prevents oxygen from oxidizing the implanted material layer before forming the second electrode.

18. The method of claim 1, wherein the material implanted into the oxide comprises tantalum.

19. The method of claim 18, wherein the oxide layer comprises tantalum.

20. The method of claim 19, wherein the oxide further comprises titanium.

* * * * *